United States Patent [19]
Domnitz

[11] Patent Number: 4,818,893
[45] Date of Patent: Apr. 4, 1989

[54] HIGH SPEED SWITCHING CIRCUIT

[75] Inventor: Robert H. Domnitz, Lexington, Mass.

[73] Assignee: Prime Computer, Inc., Natick, Mass.

[21] Appl. No.: 183,319

[22] Filed: Apr. 6, 1988

Related U.S. Application Data

[63] Continuation of Ser. No. 918,539, Oct. 10, 1986, abandoned.

[51] Int. Cl.$^4$ .............................................. H03K 3/26
[52] U.S. Cl. .................................. 307/254; 307/270; 307/255; 307/313; 330/263
[58] Field of Search ............... 307/270, 254, 255, 313; 330/263, 311, 261, 262

[56] References Cited

U.S. PATENT DOCUMENTS

| | | | |
|---|---|---|---|
| 3,786,485 | 1/1974 | Wojcik | 307/280 |
| 4,210,826 | 7/1980 | Baker | 307/270 |
| 4,345,164 | 8/1982 | Gies | 307/270 |
| 4,359,650 | 11/1982 | Newcomb | 307/270 |

Primary Examiner—Stanley D. Miller
Assistant Examiner—Nancy Thai
Attorney, Agent, or Firm—David G. Conlin; Robert M. Asher

[57] ABSTRACT

A high speed switching circuit is disclosed in which two cascode circuits are coupled and operated in push-pull operation. The cascode circuits are clamped to avoid slowing down of the transistors due to saturation.

17 Claims, 2 Drawing Sheets

HIGH SPEED SWITCHING CIRCUIT

This is a continuation of co-pending application Ser. No. 918,539 filed on 10-10-86 and now abandoned.

BACKGROUND OF THE INVENTION

This invention relates to an electronic circuit with extremely fast switching speed. In particular, the circuit provides a large output voltage swing for a video monitor.

The usual method of achieving fast switching speed with the large output voltage swing required in a video monitor is to use a class A linear amplifier with wide bandwidth. Such an amplifier can be used to drive the load directly or it may be followed by an emitter follower or cascode driver. All of these methods are limited in switching speed by the bandwidth of the class A stage. Class A stages also have the disadvantage of a high power dissipation. The heat generated by these circuits can impair the reliability of the circuitry, making it less efficient and more costly. Fans may be required to keep the circuitry cool.

Switching circuits which use an emitter follower drive may be susceptible to damage by voltage transients at the load. Such transients are often encountered when driving cathode ray tubes, for example.

SUMMARY OF THE INVENTION

The invention is directed to a high speed switching circuit in which two cascode circuits are connected so that they operate in a push-pull arrangement. Clamps are provided to prevent the transistors of the cascode circuits from saturating. Additional reactive elements, such as inductors and capacitors can be added to increase the speed of the switching circuit. Spark gaps may be provided at the output of the circuit to protect the circuitry against arcing transients from a CRT.

Rather than using a single-ended cascode output of the prior art, the invention provides two cascode circuits in push-pull operation, thus providing active pull-up and pull-down. This results in fast switching in both directions and eliminates the high power load resistor which is common to single-ended designs. Thus, there is lower power dissipation and less heat is generated. Thus, the circuitry will suffer less degradation due to heat and will exhibit a longer life.

Other objects and advantages of the present invention will become apparent during the following description of the presently preferred embodiment of the invention taken in conjunction with the drawings.

DETAILED DESCRIPTION OF THE PREFERRED EMBODIMENT

Figure 1:
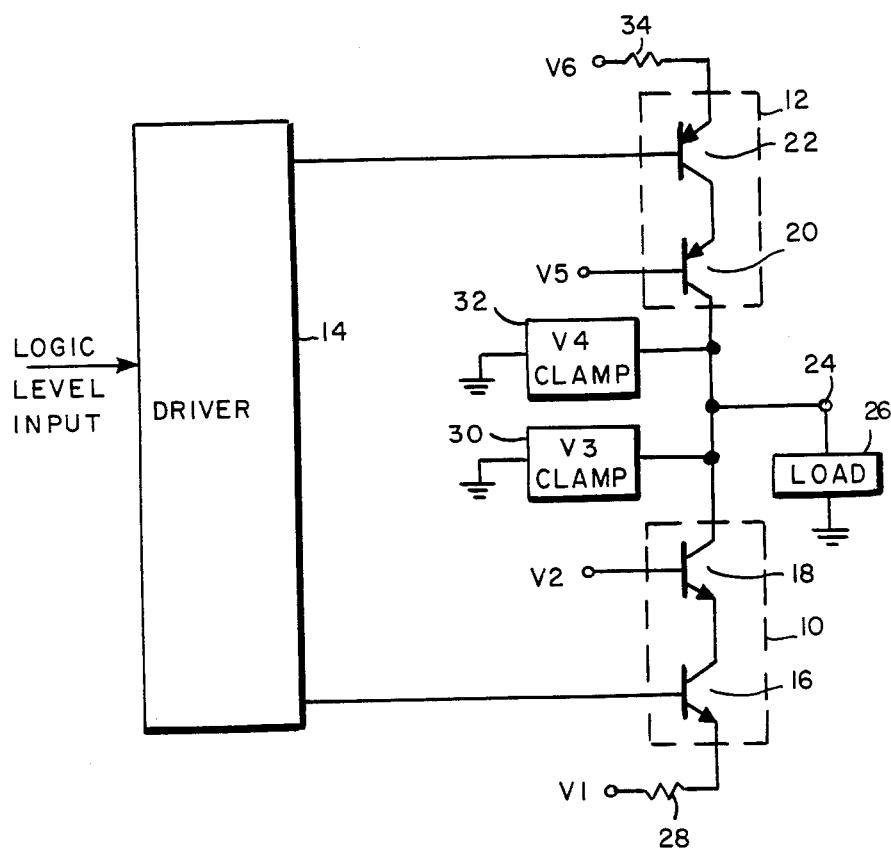
FIG. 1 is a block diagram schematic of the high speed switching circuit of the present invention.

Turning now to the drawings, FIG. 1 shows the switching circuit of the present invention which includes two cascode circuits 10, 12 which operate in push-pull fashion in response to a driver 14. The driver 14 of the preferred embodiment is controlled by a logic level input. The first cascode circuit 10 includes two npn transistors in which the collector of a first transistor 16 is connected to the emitter of a second transistor 18.

The second cascode circuit includes two pnp transistors in which a third transistor 20 has an emitter directly coupled to the collector of a fourth transistor 22. The driver 14 provides the same AC drive signal to the base of the first transistor 16 and the fourth transistor 22. The two signals, however, are at different DC levels. The AC drive signal is the same so that the cascode circuits synchronously turn on and off. One cascode circuit turns on at the same time the other cascode circuit turns off.

During the normal push-pull operation of the circuit when the cascode circuit 10 is turned on, current is pulled through an output terminal 24 from a load 26 at the same time the other cascode circuit 12 is turned off. In the other half cycle of the operation, cascode circuit 12 is turned on and current is pushed through the output terminal 24 and into the load 26. During this phase of the cycle, the cascode circuit 10 is turned off.

In order to obtain the desired voltage swing and operation, a negative voltage V1 is coupled to the emitter of the first transistor 16. A current limiting resistor 28 is connected between the negative voltage V1 and the emitter of the first transistor 16 to avoid currents which are too large for the transistors to handle. The base of the second transistor 18 is biased to a negative voltage V2 such that V2 is closer to zero than V1. In other words, voltage V1 is more negative than voltage V2. In order to prevent the transistors of the cascode circuit 10 from slowing down due to saturation, a clamp 30 is provided at the collector of the second transistor 18. The clamp prevents the voltage at the output of the cascode circuit 10 from becoming more negative than V3. V3 is closer to zero than V2. The relationship between the voltage V1, V2, and V3 is such that the absolute value of V1 is greater than the absolute value of V2 which is greater than the absolute value of V3. V1, V2 and V3 are all negative voltages.

A similar arrangement is provided for the second cascode circuit 12. A positive voltage V6 is provided at the emitter of the fourth transistor 22. A current limiting resistor 34 helps avoid currents which are too large for the transistors to handle. The base of the third transistor 20 is biased to a voltage V5. The voltage V5 is a positive voltage less than the voltage V6. In order to avoid slowing down of the transistors of the cascode circuit 12 due to saturation, a clamp 32 is provided at the output of cascode circuit 12. The clamp 32 prevents the voltage at the output of the cascode circuit 12 from rising above a voltage V4 such that V4 is a positive voltage less than the voltage V5. For convenience, the two cascode circuits have been illustrated with one operating at positive voltages and the other at negative voltages, it should be understood that the present invention is not limited by this illustration. The invention may be practiced with the voltage biases changed to suit the particular circuit design.

Figure 2:
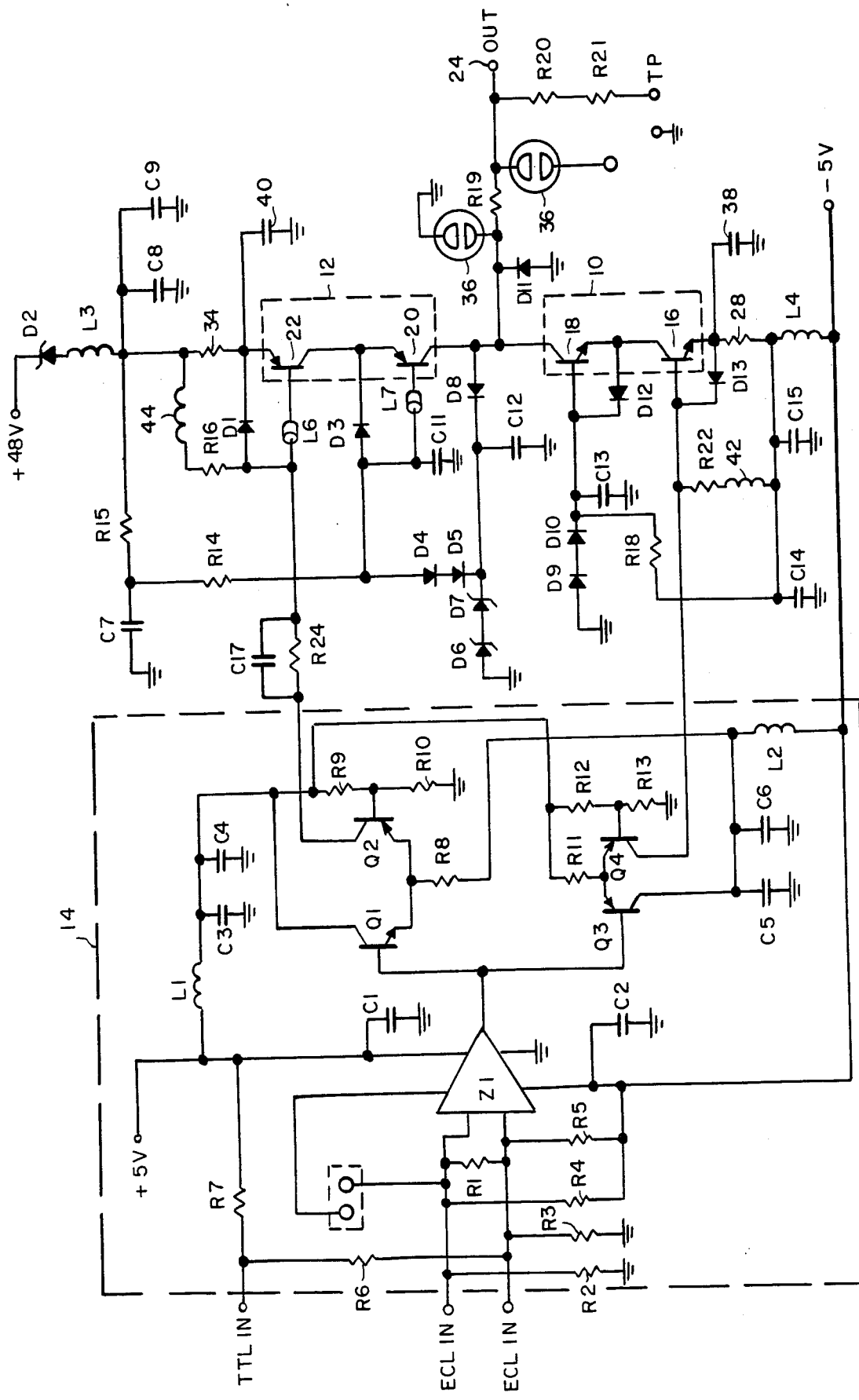
FIG. 2 is a schematic of a high speed circuit of the present invention for use with a CRT monitor.

Referring now to FIG. 2, a detailed schematic diagram of a switching circuit of the present invention for use with a CRT monitor is shown. Numerals remain the same as in FIG. 1 for components which can be easily found in both drawings. The first cascode circuit 10 has its output clamped by diode D11 to prevent it from falling below −0.7 volts. The base of the second transistor 18 is biased to −1.4 volts by diodes D9 and D10. The voltage at the collector of transistor 18 is kept from getting closer than 0.7 volts to the base voltage so as to avoid slowing the transistor. If the base and collector voltage became equal the transistor would saturate. In a similar manner for the second cascode circuit, the collector of the transistor 20 is kept from rising above about 35 volts by the diode clamp D8, the voltage of the clamp being set by diodes D6 and D7. The base of the transistor 20 is biased at a voltage of about 36 volts by diodes D4, D5, D6 and D7. In order to prevent damage to the switching circuit from transients caused by the CRT, the output is shunted by a pair of arc gaps 36.

The presently preferred embodiment of FIG. 2 includes a number of additional reactive elements for increasing the speed of the switching circuit. A capacitor 38 is connected between the emitter of the first transistor 16 and ground. The capacitor 38 in the preferred embodiment is 470 pF and will pull some additional current through the cascode circuit 10 to charge itself up at the beginning of each half cycle in which the cascode circuit 10 is turned on. The boost at the beginning of the half cycle shortens the fall time of the output to a small additional extent. The capacitor 38 will discharge when the cascode circuit 10 is off. Similarly, to provide equal balance on the other half of the cycle, a capacitor 40 is connected between the emitter of the fourth transistor 22 and ground. This capacitor 40 is also 470 pF in the presently preferred embodiment and provides an extra boost of current in the beginning of the half cycle in which the cascode circuit 12 is turned on. The extra boost shortens the rise time of the output to a small additional extent. While the cascode circuit 12 is off, the capacitor 40 charges up.

A still further boost of switching speed is provided by inductors 42 and 44. The inductors 42 and 44 are coupled to the base electrodes of the first transistor 16 and the fourth transistor 22, respectively. The inductors provide an extra spike of current into each of the cascode circuits 10 and 12 when they are turned on. Thus, when the driver 14 provides the drive signal which turns on cascode circuit 12, the inductor 42 adds a spike of current onto the beginning of the drive signal into the base of first transistor 16, thus causing the cascode circuit 10 to turn on harder in the beginning of the cycle. Likewise, when the drive signal from the driver 14 turns on the cascode circuit 12, the inductor 44 adds a spike of current to turn the cascode circuit 12 on harder for a brief moment at the beginning of its half cycle.

The values of the components in the presently preferred embodiment of FIG. 2 are provided in the following table:

TABLE

| Ref. Numeral | Value |
| --- | --- |
| C1 | .01 μF |
| C2 | .01 μF |
| D11 | 1N4305 |
| D12 | 1N4148 |
| D13 | 1N4148 |
| L1 | Ferroxcube VK 200-10/3B |
| L2 | Ferroxcube VK 200-10/3B |
| L3 | Ferroxcube VK 200-10/3B |
| L4 | Ferroxcube VK 200-10/3B |
| 44 | .39 μH |
| L6 | Fair-rite 2664000101 |
| C3 | 1 μF |
| C4 | .01 μF |
| C5 | .01 μF |
| C6 | 1 μF |
| C7 | .01 μF |
| C8 | .1 μF |
| C9 | 1 μF |
| C11 | .01 μF |
| C12 | .1 μF |
| C13 | .01 μF |
| C14 | .1 μF |

TABLE-continued

| Ref. Numeral | Value |
| --- | --- |
| C15 | 10 μF |
| 38 | 470 pF |
| C17 | .001 μF |
| 40 | 470 pF |
| D1 | 1N4148 |
| D2 | 1N5342B |
| D3 | 1N4148 |
| D4 | 1N4148 |
| D5 | 1N4148 |
| D6 | 1N5353B |
| D7 | 1N5352B |
| D8 | 1N4305 |
| D9 | 1N4148 |
| D10 | 1N4148 |
| L7 | Fair-rite 2664000101 |
| 42 | .39 μH |
| Q1 | 2N5770 |
| Q2 | 2N3866 |
| Q3 | 2N5771 |
| Q4 | 2N5771 |
| 16 | 2N3866 |
| 18 | 2N3866 |
| 20 | 2N5160 |
| 22 | 2N5160 |
| R1-R7 | Chosen to be compatible with driver |
| R8 | 330 ohms |
| R9 | 120 ohms |
| R10 | 39 ohms |
| R11 | 160 ohms |
| R12 | 120 ohms |
| R13 | 39 ohms |
| R14 | 390 ohms |
| R15 | 390 ohms |
| R16 | 68 ohms |
| 34 | 7.5 ohms |
| R18 | 470 ohms |
| R19 | 100 ohms |
| R20 | 1K ohms |
| R21 | 1K ohms |
| R22 | 68 ohms |
| 28 | 7.5 ohms |
| R24 | 1K ohms |
| Z1 | 10125 |

In accordance with the present invention, a standard TTL or ECL input can drive an output voltage signal swing of 35 volts. Typically the circuit of the present invention can provide switching speeds of 4 ns (20%-80%) into a 10 pF load capacitance.

Of course, it should be understood that various changes and modifications to the preferred embodiments described above will be apparent to those skilled in the art. For example, other means of providing a clamp other than the diode clamps shown in FIG. 2 and other methods of biasing the voltages at the various transistor electrodes are possible. These and other changes can be made without departing from the spirit and scope of the invention and without diminishing its attendant advantages. It is, therefore, intended that such changes and modifications be covered by the following claims.

I claim:

1. An electronic circuit comprising:
    a first cascode circuit wherein a collector of a first common-emitter stage is directly coupled to an emitter of a first common-base stage;
    a second cascode circuit wherein an emitter of a second common-base stage is directly coupled to a collector of a second common-emitter stage;
    said first common-base stage having a collector coupled to a collector of said second common-base stage; and means, connected to said first and second common-emitter stage, for driving said first and second cascode circuits so that said cascode circuits operate in push-pull fashion.

2. The electronic circuit of claim 1 further comprising:
   means for clamping the voltage at the collector of said first common-base stage to prevent it from falling below a value greater than the voltage at the base of said first common-base stage; and
   means for clamping the voltage at the collector of said second common-base stage to prevent it from rising above a value less than the voltage at the base of said second common-base stage.

3. The electronic circuit of claim 1 further comprising a resistor coupled to the emitter of said first common-emittter stage and a resistor coupled to the emitter of said second common-emitter stage, each of said resistors limiting the current flow through the stage to which it is coupled.

4. A high speed switching circuit comprising:
   a first cascode circuit including a first common-emitter stage with a collector directly coupled to an emitter of a first common-base stage;
   a second cascode circuit including a (third transistor) second common-base stage having an emitter directly coupled to a collector of a second common-emitter stage;
   means coupled to a collector of said first common-base stage and to a collector of said second common-base stage for providing an output from said switching circuit; and
   means for supplying a drive signal to the base of said first common-emitter stage and to the base of said second common-emitter stage.

5. The high speed switching circuit of claim 4 wherein said means for supplying a drive signal includes means for receiving a logic level input signal.

6. The high speed switching circuit of claim 4 further comprising means coupled to the emitter of said first common-emitter stage for receiving a first source voltage and means coupled to the emitter of said second common-emitter stage for receiving a second source voltage.

7. The high speed switching circuit of claim 6 further comprising a first current limiting resistor coupled between said first source voltage receiving means and said first common-emitter stage and a second current limiting resistor coupled between said second source voltage receiving means and said second common-emitter stage.

8. The high speed switching circuit of claim 6 further comprising means for biasing the voltage at the base of said first common-base stage to a voltage which is greater than said first source voltage and means for clamping the collector of said first common-base stage so that the voltage at said collector of said first common-base stage does not fall below a voltage which is a predetermined amount greater than the voltage at the base of said first common-base stage.

9. The high speed switching circuit of claim 8 further comprising means for biasing the base of said second common-base stage to a voltage which is less than said second source voltage and means for clamping the collector of said second common-base stage so that the voltage at said collector of said second common-base stage does not exceed a voltage which is a predetermined amount less than the voltage at the base of said second common-base stage.

10. The high speed switching circuit of claim 4 wherein said means for supplying a drive signal includes a first inductance coupled to the base of said first common-emitter stage and a second inductance coupled to the base of said second common-emitter stage to add a spike into said drive signal to cause said cascode circuits to turn on harder.

11. The high speed switching circuit of claim 4 further comprising a first capacitor coupled to the emitter of said first common-emitter stage and a second capacitor coupled to the emitter of said second common-emitter stage, said capacitors increasing the speed of said switching circuit.

12. The high speed switching circuit of claim 4 further comprising an arc gap connected to said output providing means.

13. The high speed switching circuit of claim 4 wherein said drive signal causes said cascode circuits to alternately turn on and off to achieve push-pull operations.

14. A high speed switching circuit for driving a cathode ray tube monitor comprising:
   a first cascode circuit including a first common-emitter stage with a collector directly coupled to an emitter of a first common-base stage;
   a second cascode circuit including a second common-base stage having an emitter directly coupled to a collector of a second common-emitter stage;
   means coupled to a collector of said first common-base stage and to a collector of said second common-base stage for providing an output from said switching circuit;
   means coupled to an emitter of said first common-emitter stage for receiving a first source voltage;
   means coupled to an emitter of said second common-emitter stage for receiving a second source voltage;
   a first current limiting resistor coupled between said first source voltage receiving means and said first common-emitter stage;
   a second current limiting resistor coupled between said second source voltage receiving means and said second common-emitter stage;
   means for clamping the collector of said first common-base stage so that the voltage at said collector of said first common-base stage does not fall below a voltage which is a predetermined amount greater than the voltage at the base of said first common-base stage;
   means for clamping the collector of said second common-base stage so that the voltage at said collector of said second common-base stage does not exceed a voltage which is a predetermined amount less than the voltage at the base of said second common-base stage; and
   means for driving said first and second cascode circuits so that said cascode circuits operate in push-pull fashion.

15. The high speed switching circuit of claim 14 wherein said means for driving said first and second cascode circuits includes a first inductance coupled to the base of said first common-emitter stage and a second inductance coupled to the base of said second common-emitter stage to add a spike into said drive signal to cause said cascode circuits to turn on harder.

16. The high speed switching circuit of claim 14 further comprising a first capacitor coupled to the emitter of said first common-emitter stage and a second capacitor coupled to the emitter of said second common-emitter stage, said capacitors increasing the speed of said switching circuit.

17. The high speed switching circuit of claim 14 further comprising an arc gap connected to said output providing means.

* * * * *